(12) United States Patent
Tsai et al.

(10) Patent No.: US 9,349,595 B2
(45) Date of Patent: May 24, 2016

(54) METHODS OF MANUFACTURING SEMICONDUCTOR DEVICES

(75) Inventors: Cheng-Hsiung Tsai, Miaoli County (TW); Chung-Ju Lee, Hsin-Chu (TW); Hsin-Chieh Yao, Yunlin County (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 86 days.

(21) Appl. No.: 13/546,800

(22) Filed: Jul. 11, 2012

(65) Prior Publication Data

US 2014/0017894 A1    Jan. 16, 2014

(51) Int. Cl.
| | | |
|---|---|---|
| *H01L 21/311* | (2006.01) | |
| *H01L 21/033* | (2006.01) | |
| *H01L 21/768* | (2006.01) | |
| *H01L 21/02* | (2006.01) | |

(52) U.S. Cl.
CPC ...... *H01L 21/0337* (2013.01); *H01L 21/31144* (2013.01); *H01L 21/76816* (2013.01); *H01L 21/02115* (2013.01)

(58) Field of Classification Search
CPC ............ H01L 21/0338; H01L 21/3088; H01L 21/0337; H01L 21/18; H01L 21/34; H01L 21/31144; H01L 21/32115; H01L 21/32134; H01L 21/76816

USPC ............. 216/40, 41; 257/20, 734; 361/321.4; 428/336; 430/312, 313, 314; 438/231, 438/301, 303, 592, 678, 689, 690, 692, 694, 438/696, 700, 702, 706, 717, 743, 763; 716/50

See application file for complete search history.

(56) References Cited

U.S. PATENT DOCUMENTS

| | | | |
|---|---|---|---|
| 5,937,308 A * | 8/1999 | Gardner et al. ............... 438/424 |
| 2002/0132485 A1 * | 9/2002 | DeOrnellas et al. .......... 438/710 |
| 2003/0003756 A1 * | 1/2003 | Yu ................................ 438/706 |
| 2005/0136682 A1 * | 6/2005 | Hudson et al. ................ 438/714 |
| 2008/0122125 A1 * | 5/2008 | Zhou ............................. 257/797 |
| 2008/0200026 A1 * | 8/2008 | Koh et al. ...................... 438/643 |
| 2008/0220600 A1 * | 9/2008 | Alapati et al. ................ 438/584 |
| 2009/0140398 A1 * | 6/2009 | Jung ............................. 257/638 |
| 2011/0129991 A1 | 6/2011 | Armstrong et al. |
| 2011/0171582 A1 * | 7/2011 | Farooq ................ H01L 21/3085 430/314 |

* cited by examiner

*Primary Examiner* — Shamim Ahmed
(74) *Attorney, Agent, or Firm* — Slater Matsil, LLP (57) ABSTRACT

Methods of manufacturing semiconductor devices are disclosed. In one embodiment, a material layer is formed over a workpiece. The workpiece includes a first portion, a second portion, and a hard mask disposed between the first portion and the second portion. The material layer is patterned, and first spacers are formed on sidewalls of the patterned material layer. The patterned material layer is removed, and the second portion of the workpiece is patterned using the first spacers as an etch mask. The first spacers are removed, and second spacers are formed on sidewalls of the patterned second portion of the workpiece. The patterned second portion of the workpiece is removed, and the hard mask of the workpiece is patterned using the second spacers as an etch mask. The first portion of the workpiece is patterned using the hard mask as an etch mask.

20 Claims, 9 Drawing Sheets

METHODS OF MANUFACTURING SEMICONDUCTOR DEVICES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Upper material layers of some semiconductor devices include metallization layers in which conductive lines and vias are formed. The conductive lines and vias provide interconnects for the integrated circuits formed on or over the semiconductor substrate. The metallization layers include multi-level interconnects that are typically formed in back-end-of-line (BEOL) processes.

The semiconductor industry continues to improve the integration density of various electronic components (e.g., transistors, diodes, resistors, capacitors, conductive lines, vias, etc.) by continual reductions in minimum feature size, which allow more components to be integrated into a given area. As feature sizes are reduced, manufacturing processes of semiconductor devices become more challenging.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to patterning methods for forming conductive lines of semiconductor devices. Novel semiconductor device manufacturing methods will be described herein.

Figure 1:
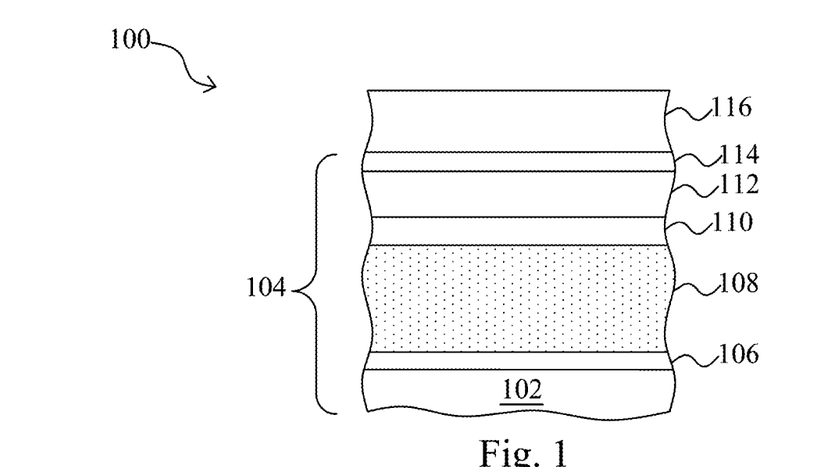
FIGS. 1 through 16 show cross-sectional views of a semiconductor device at various stages of manufacturing in accordance with an embodiment of the present disclosure.

FIGS. 1 through 16 show cross-sectional views of a semiconductor device 100 at various stages of manufacturing in accordance with an embodiment of the present disclosure. Referring first to FIG. 1, there is shown a cross-sectional view of a semiconductor device 100 in accordance with an embodiment. The semiconductor device 100 includes a workpiece 104. The workpiece 104 may include a semiconductor substrate 102 comprising silicon or other semiconductor materials and may be covered by an insulating layer, for example. The substrate 102 may comprise silicon oxide over single-crystal silicon, for example. The substrate 102 may include other conductive layers or other semiconductor elements, e.g., transistors, diodes, etc. Compound semiconductors, GaAs, InP, Si/Ge, or SiC, as examples, may be used in place of silicon. The substrate 102 may comprise a silicon-on-insulator (SOI) or a germanium-on-insulator (GOI) substrate, as examples. The workpiece 104 may also include other active components or circuits formed within or over the substrate 102, e.g., in a front-end-of-line (FEOL) process, not shown.

In accordance with embodiments, the workpiece 104 includes a first portion 102/106/108, a hard mask 110 disposed over the first portion 102/106/108, and a second portion 112/114 disposed over the hard mask 110. The first portion 102/106/108 includes the substrate 102 and an etch stop layer 106 disposed over the substrate 102. The etch stop layer 106 comprises an insulating material such as a nitrogen-, silicon-, and carbon-containing film, as an example. The etch stop layer 106 comprises a thickness of about 200 Angstroms in some embodiments. The etch stop layer 106 may alternatively comprise other materials and dimensions. The first portion 102/106/108 also includes an insulating material layer 108 disposed over the etch stop layer 106. The insulating material layer 108 comprises a low dielectric constant (k) material layer having a dielectric constant less than a dielectric constant of silicon dioxide, which is about 3.9, in some embodiments. The insulating material layer 108 may comprise a porous dielectric oxygen-, carbon- and silicon-containing film (e.g., generally referred to as an SiOC film), as an example. The insulating material layer 108 comprises a thickness of about 1,000 Angstroms to about 2 µm in some embodiments. Alternatively, the insulating material layer 108 may comprise other materials and dimensions.

The hard mask 110 is disposed over the insulating material layer 108. The hard mask 110 is used to define the insulating material layer 108. The hard mask 110 comprises a metal or an oxide material and has a thickness of about 300 Angstroms. The hard mask 110 comprises TiN in some embodiments, for example. Alternatively, the hard mask 110 may comprise other materials and dimensions.

The second portion 112/114 of the workpiece 104 includes a bottom layer 112 disposed over the hard mask 110 and a middle layer 114 disposed over the bottom layer 112. The bottom layer 112 comprises about 1,000 Angstroms of a carbon organic material, and the middle layer 114 comprises about 330 Angstroms of a silicon-containing carbon film in some embodiments. Alternatively, the bottom layer 112 and the middle layer 114 may comprise other materials and dimensions. The middle layer 114 assists in the definition of the bottom layer 112 in some embodiments, for example.

The etch stop layer 106 and the insulating material layer 108 are also collectively referred to herein, e.g., in some of the claims, as a first material layer 106/108. The bottom layer 112 and the middle layer 114 are also collectively referred to herein, e.g., in some of the claims, as a second material layer 112/114.

Embodiments of the present disclosure comprise novel methods of patterning the insulating material layer 108 shown in FIG. 1. Material layers 110, 112, and 114 comprise sacrificial material layers that are utilized in a multiple step patterning procedure. One layer of photoresist 116 and two spacer materials 120 (not shown in FIG. 1: see FIG. 3) and 130 (see FIG. 8) are also utilized in the multiple step patterning procedure, to be described further herein.

Referring again to FIG. 1, to pattern the insulating material layer 108, first, a material layer 116 is formed over the workpiece 104. The material layer 116 comprises a layer of photoresist in some embodiments. The material layer 116 may alternatively comprise other types of photosensitive materials. The material layer 116 comprises a thickness of about 750 Angstroms in some embodiments. Alternatively, the material layer 116 may comprise other materials and dimensions.

Figure 2:
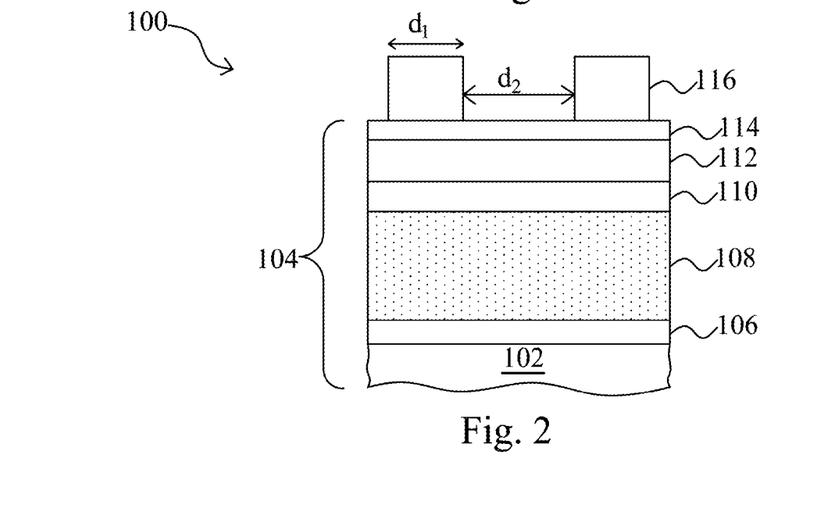

The material layer 116 is patterned using lithography, e.g., by exposing the material layer 116 to light or energy transmitted through or reflected from a lithography mask having a desired pattern thereon. Alternatively, the material layer 116 may be directly patterned, e.g., using a laser. The material layer 116 is developed, and unexposed portions (or exposed portions, depending on whether the material layer 116 comprises a positive or negative photoresist) of the material layer 116 are ashed and/or etched away, as shown in FIG. 2.

In some embodiments, the material layer 116 is patterned with features comprising a minimum feature size for the semiconductor device 100, for example. Dimension $d_1$ comprising a width of a feature of the material layer 116 may comprise about 48 nm, and dimension $d_2$ comprising a space between features of the material layer 116 may comprise about 80 nm in an embodiment, as an example. Alternatively, the patterned material layer 116 may comprise other dimensions.

After the deposition of the material layer 116 and the patterning of the material layer 116, the workpiece 104 is placed in an etching chamber. The workpiece 104 is not removed from the etching chamber during the remainder of the manufacturing processes that are used to pattern the insulating material layer 108, in some embodiments. The manufacturing steps shown in FIGS. 3 through 14 are performed in-situ in the etching chamber in these embodiments, for example.

Figure 3:
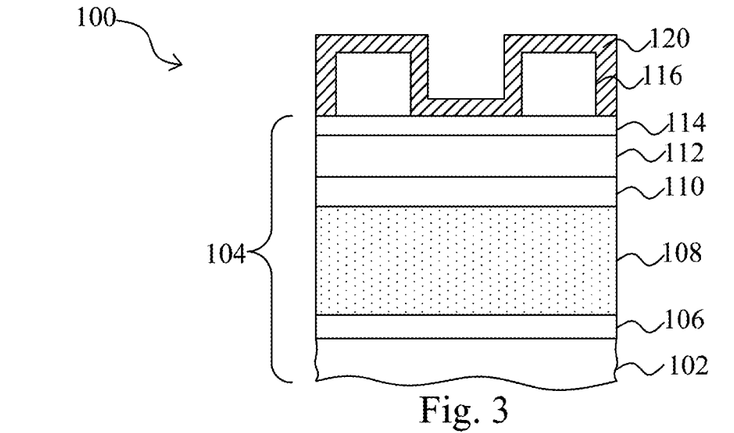

Next, a first spacer material 120 is formed over the patterned material layer 116, as shown in FIG. 3. The first spacer material 120 is formed by introducing a gas into the etching chamber in some embodiments. The first spacer material 120 is formed by exposing the workpiece 104 to $[C_{(n)}H_{(2n+2)}+N_2]$ plasma or $C_{(n)}H_{(2n+2)}$ plasma in some embodiments, for example, wherein n=1, 2, 3, etc. If n=1, $[CH_4+N_2]$ plasma or $CH_4$ plasma is used to form the first spacer material 120, for example. If n=2, $[C_2H_6+N_2]$ plasma or $C_2H_6$ plasma is used to form the first spacer material 120, as another example. The first spacer material 120 comprises a nitrogen-containing hydrogenated amorphous carbon (a-C:H:N) film or a carbon-rich containing film in some embodiments. The first spacer material 120 comprises a thickness of about 50 nm or less, for example. Alternatively, the first spacer material 120 may comprise other materials and dimensions. The first spacer material 120 advantageously comprises a material that may be formed in the etching chamber, without removing the workpiece 104 from the etching chamber. The first spacer material 120 formation process advantageously does not use a chemical vapor deposition (CVD) process in some embodiments, for example, which may involve removing the workpiece 104 from the etching chamber and moving the workpiece 104 to a separate plasma enhanced CVD (PECVD) chamber.

Figure 4:
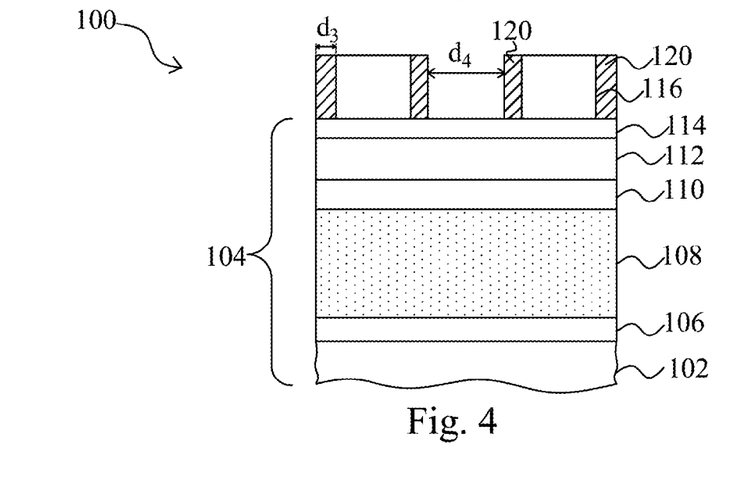

The workpiece 104 is exposed to an etch process, which removes the first spacer material 120 from top surfaces of the material layer 116 and the middle layer 114, as shown in FIG. 4. The etch process comprises an anisotropic etch process that is a directional etch process adapted to remove more of the first spacer material 120 from exposed top surfaces of the workpiece 104 than on sidewalls of features, such as the patterned material layer 116. The first spacer material 120 left remaining over the workpiece 104 resides on sidewalls of the patterned material layer 116. The first spacers 120 comprise a width comprising dimension $d_3$ that is about ½ the minimum feature size of the semiconductor device 100 in some embodiments, for example. Dimension $d_3$ comprises about 16 nm in an embodiment, as another example. A distance between adjacent first spacers 120 comprises dimension $d_4$, wherein dimension $d_4$ comprises about 48 nm in some embodiments. Alternatively, dimensions $d_3$ and $d_4$ may comprise other values.

Figure 5:
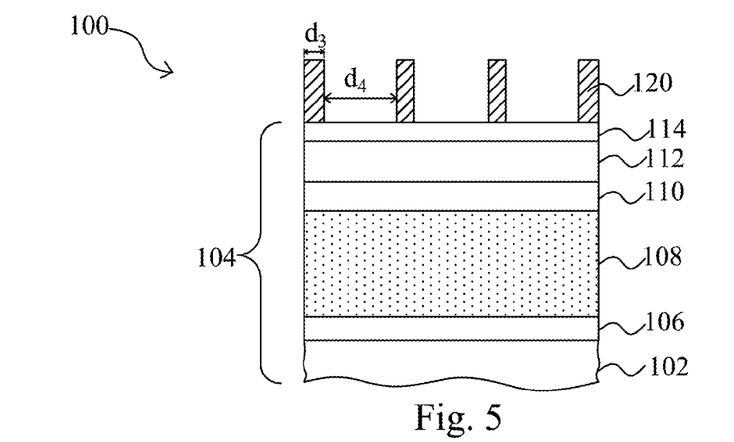
Figure 6:
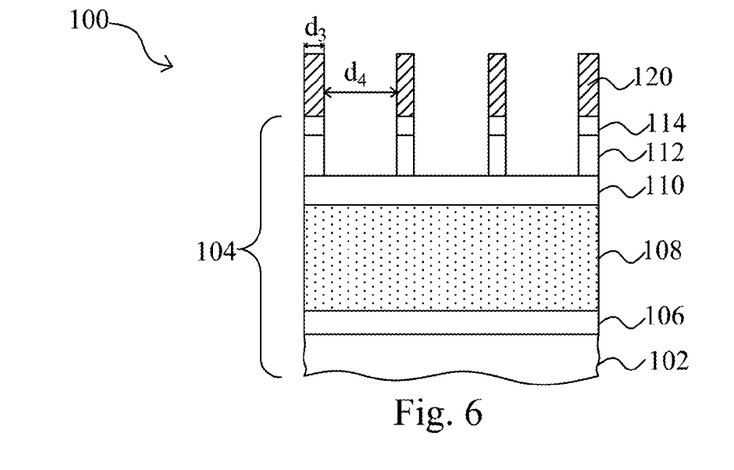
Figure 7:
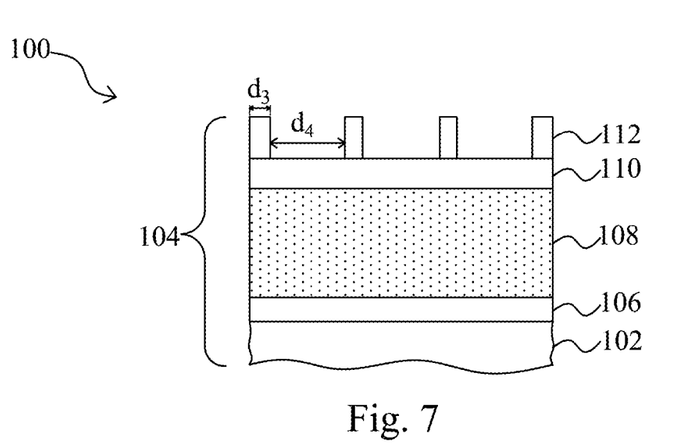

The patterned material layer 116 is then removed, as shown in FIG. 5. The first spacers 120 are then used as an etch mask while portions of the middle layer 114 and bottom layer 112 are etched away, as shown in FIG. 6. The first spacers 120 are removed using an etch process and/or an ash process, as shown in FIG. 7. The middle layer 114 is also removed in some embodiments, also shown in FIG. 7. The patterned bottom layer 112 comprises substantially the same dimension $d_3$ as the first spacers 120 and features in the patterned bottom layer 112 are spaced apart by substantially the same dimension $d_4$ as the first spacers 120.

Figure 8:
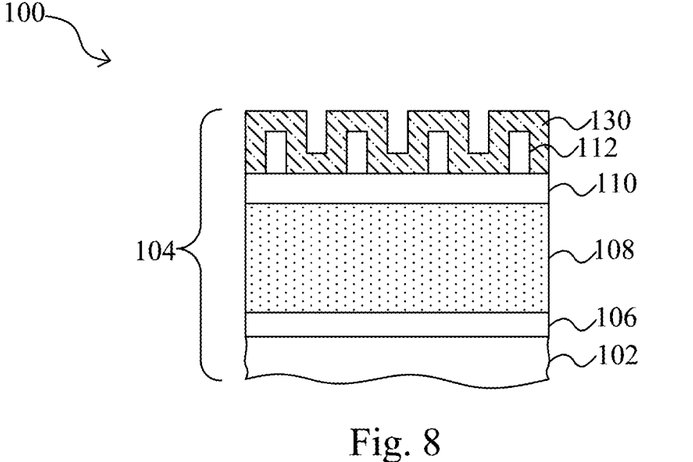
Figure 9:
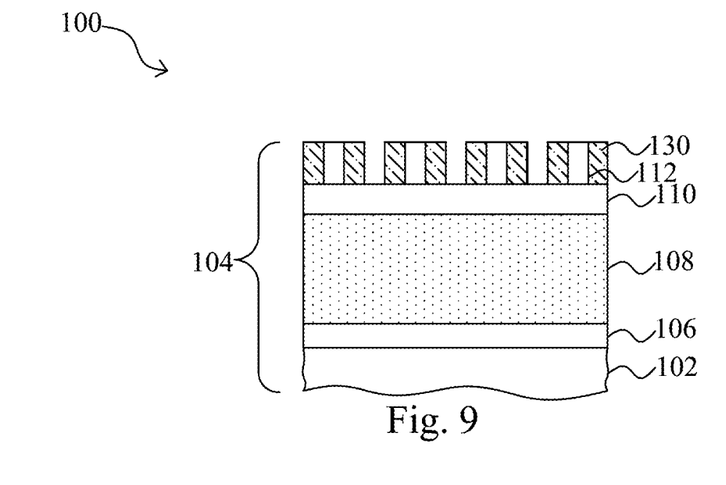

Next, a second spacer material 130 is formed over the patterned bottom layer 112, as shown in FIG. 8. The second spacer material 130 comprises a similar material formed by a similar method as described for the first spacer material 120. The second spacer material 130 is etched using an anisotropic etch process, removing the second spacer material 130 from top surfaces of the bottom layer 112 and the hard mask 110, as shown in FIG. 9. Portions of the second spacer material 130 remain on sidewalls of the patterned bottom layer 112, forming second spacers 130. The patterned bottom layer 112 is then removed, as shown in FIG. 10.

Figure 10:
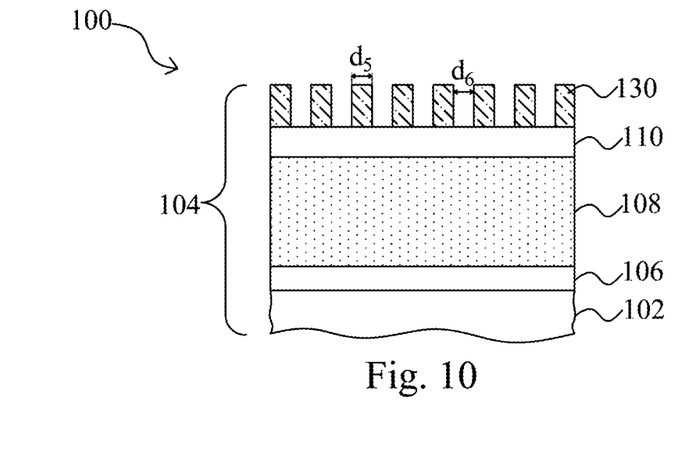

The second spacers 130 comprise a width comprising dimension $d_5$ and are spaced apart by a dimension $d_6$, as shown in FIG. 10. The second spacers 130 comprise a width comprising dimension $d_5$ that is about ¼ the minimum feature size of the semiconductor device 100 in some embodiments. Dimensions $d_5$ and $d_6$ comprise about 16 nm in some embodiments, for example. Alternatively, dimensions $d_5$ and $d_6$ may comprise other values.

Figure 11:
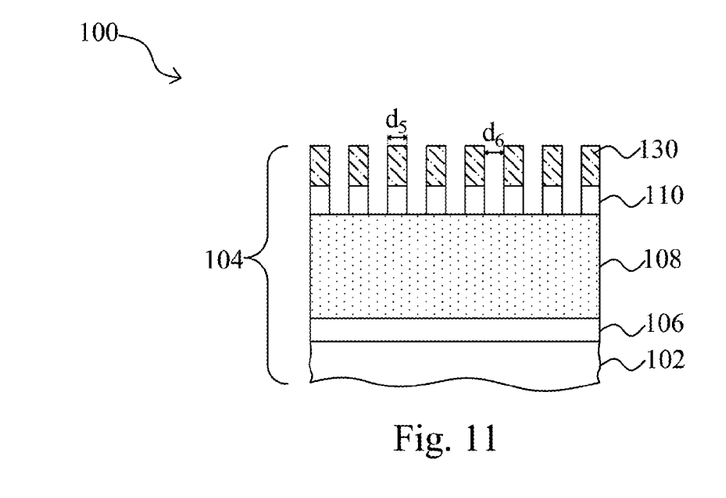
Figure 12:
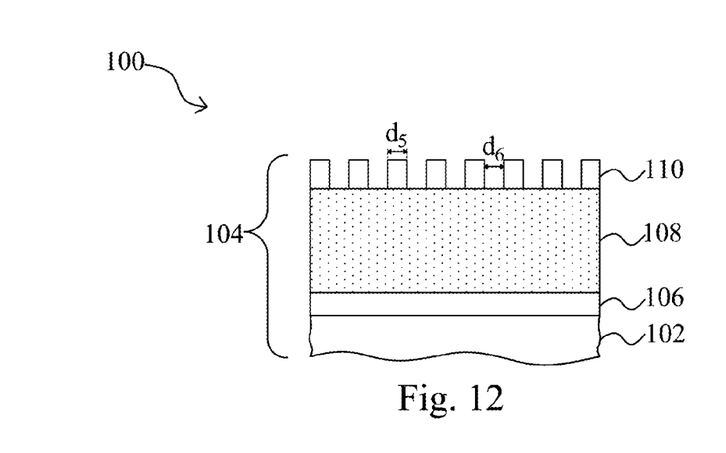
Figure 13:
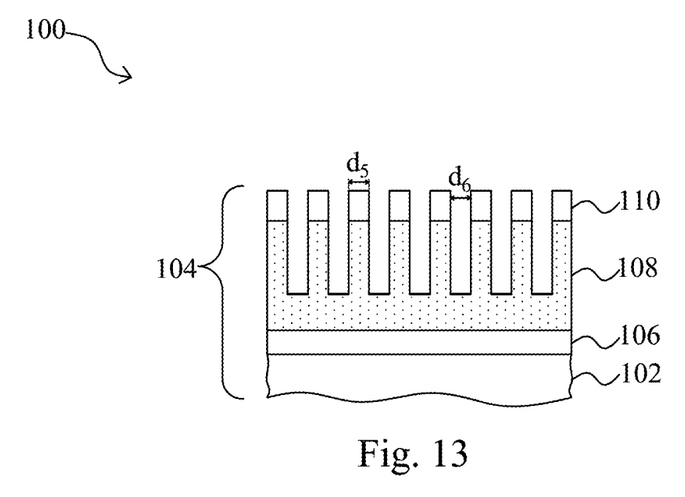

The hard mask 110 is patterned using an etch process, using the second spacers 130 as an etch mask, as shown in FIG. 11. The second spacers 130 are then removed using an etch process and/or an ash process, as shown in FIG. 12. An upper portion of the insulating material layer 108 is then patterned, using the hard mask 110 as an etch mask, as shown in FIG. 13. The patterns in the insulating material layer 108 comprise trenches for a plurality of conductive lines.

Figure 14:
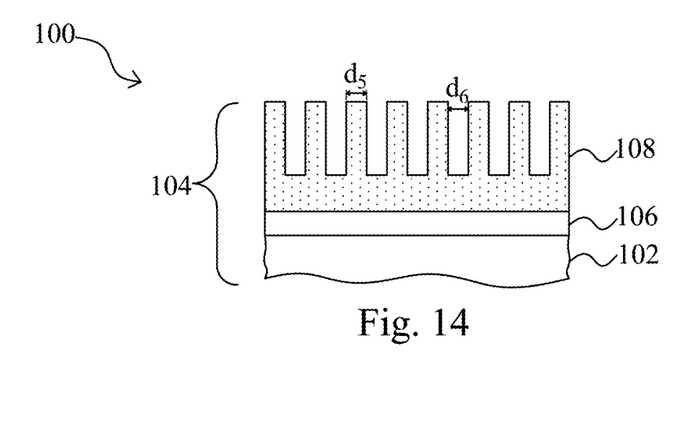
Figure 15:
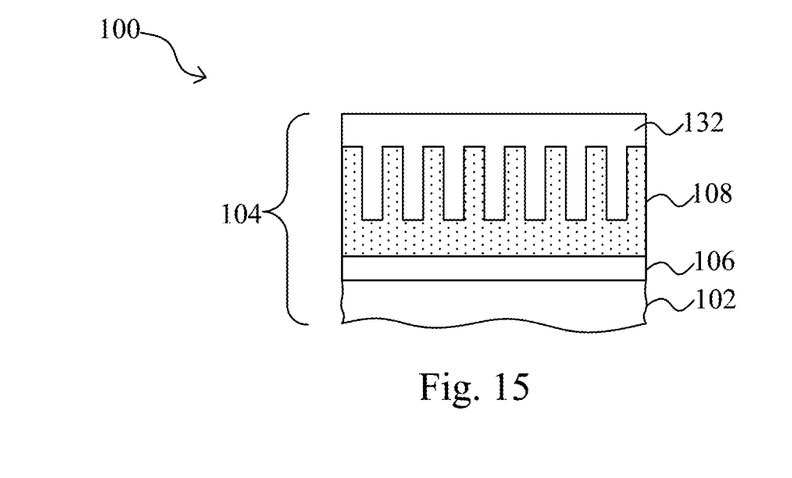
Figure 16:
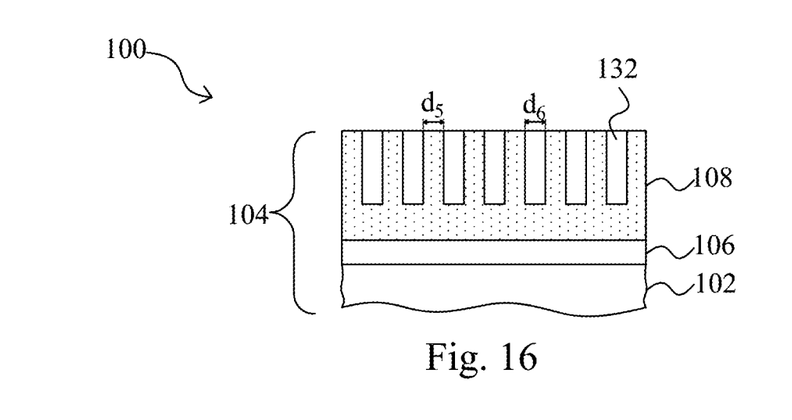

The hard mask 110 may then be removed, as shown in FIG. 14. A conductive material 132 is formed over the workpiece 104 over the insulating material layer 108, filling the patterns in the insulating material layer 108, as shown in FIG. 15. The conductive material 132 may comprise a barrier layer, a seed layer, a liner, or multiple layers or combinations thereof, for example, not shown. A fill material such as copper or a copper alloy may be formed over the layers/liner using a electrochemical plating (ECP) method and/or other deposition method, for example. A chemical-mechanical polish (CMP) process and/or etch process is used to remove excess conductive material 132 from over the top surface of the insulating material layer 108, as shown in FIG. 16, forming a plurality of conductive lines 132 in the insulating material layer 108 that extend in and out of the page by a predetermined distance. The conductive lines 132 comprise substantially the same dimensions $d_5$ and $d_6$ as the second spacers 130 and hard mask 110 shown in FIGS. 10 and 13, respectively.

Several optional processing steps and procedures will next be described. In FIGS. 11 through 13, the second spacer material 130 may optionally be left remaining over the hard mask 110 during the patterning of the insulating material 108. After the insulating material layer 108 has been patterned, the second spacer material 130 may then be removed. The hard mask 110 may optionally be left remaining in the structure, not shown. For example, in embodiments wherein the hard mask 110 comprise an oxide, the hard mask 110 may be left remaining over the insulating material layer 108, and the conductive material 132 may be deposited over the patterned hard mask 110 and insulating material layer 108. In some embodiments, only a portion of the insulating material layer 108 is patterned to form patterns for the conductive lines 132, as shown in FIG. 13. Alternatively, the entire thickness of the insulating material layer 108 may be patterned, exposing a top surface of the etch stop layer 106, not shown. A portion of the etch stop layer 106 may also be patterned in the patterning step for the insulating material layer 108, also not shown. In some embodiments, a substantial portion of the etch stop layer 106 is not removed when patterning the insulating material layer 108, as another example.

The steps shown in FIGS. 3 through 14 can advantageously be performed in one etching chamber, without removing the workpiece 104 from the etching chamber, in accordance with some embodiments. Forming the first spacer material 120, etching the first spacer material 120, removing the patterned layer of photoresist 116, patterning the second material layer 112/114, removing the first spacers 120, forming the second spacer material 130, etching the second spacer material 130, removing the patterned material layer 112, patterning the hard mask 110, removing the second spacers 130, and patterning the material layer 108 are performed in-situ in a single etching chamber, without removing the semiconductor device 100 from the etching chamber, in some embodiments, for example.

Figure 17:
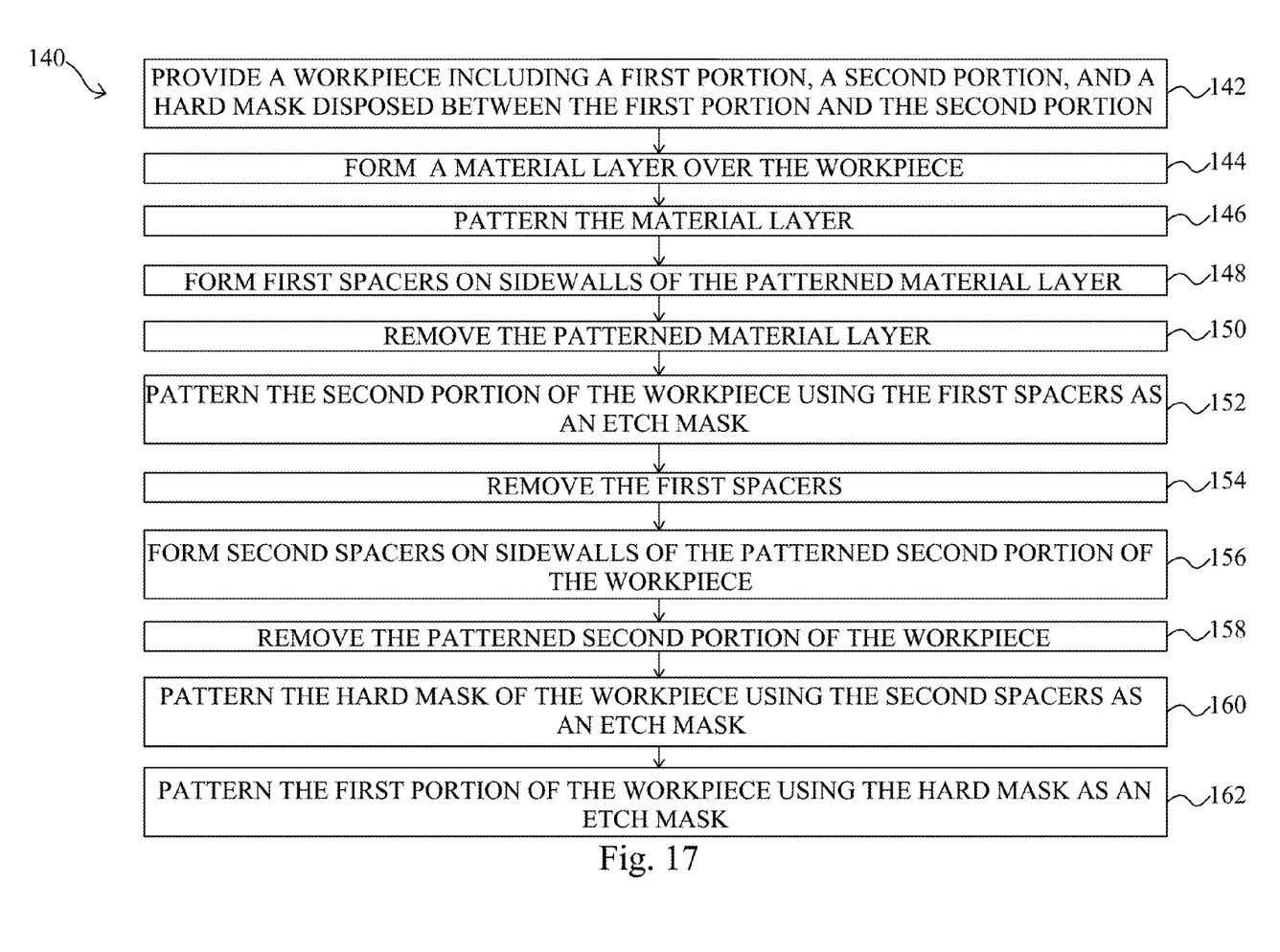
FIG. 17 is a flow chart illustrating a method of manufacturing a semiconductor device in accordance with an embodiment.

FIG. 17 is a flow chart 140 illustrating a method of manufacturing a semiconductor device 100 in accordance with an embodiment. First, in step 142, a workpiece 104 is provided that includes a first portion 102/106/108, a second portion 112/114, and a hard mask 110 disposed between the first portion 102/106/108 and the second portion 112/114. In step 144, a material layer 116 is formed over the workpiece 104. In step 146, the material layer 116 is patterned. In step 148, first spacers 120 are formed on sidewalls of the patterned material layer 116. In step 150, the patterned material layer 116 is removed. In step 152, the second portion 112/114 of the workpiece 104 is patterned using the first spacers 120 as an etch mask. In step 154, the first spacers 120 are removed. In step 156, second spacers 130 are formed on sidewalls of the patterned second portion 112 of the workpiece 104. In step 158, the patterned second portion 112 of the workpiece 104 is removed. In step 160, the hard mask 110 of the workpiece 104 is patterned using the second spacers 130 as an etch mask. In step 162, the first portion 102/106/108 (e.g., an upper portion of insulating material layer 108) of the workpiece 104 is patterned using the hard mask 110 as an etch mask.

Advantages of embodiments of the disclosure include providing novel manufacturing methods wherein spacers 120 and 130 used in the formation of BEOL interconnects 132 are formed using $[C_{(n)}H_{(2n+2)}+N_2]$ plasma or $C_{(n)}H_{(2n+2)}$ plasma. Trenches are formed in an insulating material 108 and filled to form conductive lines 132 using a damascene process in accordance with embodiments. Using only one lithography process to pattern the photoresist 116, conductive lines 132 with a ¼ pitch are achievable in accordance with embodiments of the present disclosure. The spacers 120 and 130 for the trench formation are formed in-situ using $CH_4+N_2$ plasma or $CH_4$ plasma in some embodiments, such that the deposition and etching of the spacers 120 and 130 may be performed in an "all-in-one" process chamber. The novel spacer materials 120 and 130 advantageously can be formed in an etching chamber, rather than needing to move the workpiece 104 into a different processing chamber to form the spacer materials 120 and 130.

Only one hard mask 110 is used in the structure, yet two spacer materials 120 and 130 are formed. Only two deposition and etching processes for the spacer 120 and 130 formation are used. The patterning methods described herein lower manufacturing costs and increase throughput. The deposition process for the spacers 120 and 130 is performed at a low temperature, e.g., of about 60 degrees C. in some embodiments. The spacer materials 120 and 130 are highly conformal, improving the spacer 120 and 130 formation. The first spacers 120 are used to define the middle layer 114 and bottom layer 112, and the second spacers 130 are used to define the hard mask 110. The hard mask 110 is then used to define the underlying insulating material layer 108. The novel semiconductor device manufacturing methods are easily implementable in manufacturing process flows.

In accordance with one embodiment of the present disclosure, a material layer is formed over a workpiece. The workpiece includes a first portion, a second portion, and a hard mask disposed between the first portion and the second portion. The material layer is patterned, and first spacers are formed on sidewalls of the patterned material layer. The patterned material layer is removed, and the second portion of the workpiece is patterned using the first spacers as an etch mask. The first spacers are removed, and second spacers are formed on sidewalls of the patterned second portion of the workpiece. The patterned second portion of the workpiece is removed, and the hard mask of the workpiece is patterned using the second spacers as an etch mask. The first portion of the workpiece is patterned using the hard mask as an etch mask.

In accordance with another embodiment, a method of manufacturing a semiconductor device includes forming a first material layer over a substrate, forming a hard mask over the first material layer, and forming a second material layer over the hard mask. A layer of photoresist is formed over the second material layer, and the layer of photoresist is patterned. First spacers are formed on sidewalls of the patterned layer of photoresist, and the patterned layer of photoresist is removed. The second material layer is patterned using the first spacers as an etch mask, and the first spacers are removed. Second spacers are formed on sidewalls of the patterned second material layer, and the patterned second material layer is removed. The hard mask is patterned using the second spacers as an etch mask, and the second spacers are removed. The first material layer is then patterned using the hard mask as an etch mask.

In accordance with yet another embodiment, a method of manufacturing a semiconductor device includes forming a first material layer over a substrate, forming a hard mask over the first material layer, forming a second material layer over the hard mask, and forming a layer of photoresist over the second material layer. The layer of photoresist is patterned, and a first spacer material is formed over the patterned layer of photoresist. The first spacer material is etched to remove the first spacer material from a top surface of the layer of photoresist and a top surface of the second material layer, leaving first spacers on sidewalls of the patterned layer of photoresist. The patterned layer of photoresist is removed, and the second material layer is patterned using the first spacers as an etch mask. The first spacers are removed, and a second spacer material is formed over the patterned second material layer. The second spacer material is etched to remove the second spacer material from a top surface of the second material layer and a top surface of the hard mask, leaving second spacers on sidewalls of the patterned second material layer. The patterned second material layer is removed, and the hard mask is patterned using the second spacers as an etch mask. The second spacers are removed, and the first material layer is patterned using the hard mask as an etch mask.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    forming a material layer over a workpiece, the workpiece including a first portion, a second portion, and a hard mask disposed between the first portion and the second portion, the hard mask comprising a metal;
    patterning the material layer;
    forming first spacers on sidewalls of the patterned material layer using a $[C_{(n)}H_{(2n+2)}+N_2]$ plasma at a temperature of less than about 60° C.;
    removing the patterned material layer;
    patterning the second portion of the workpiece using the first spacers as an etch mask;
    removing the first spacers;
    forming second spacers on sidewalls of the patterned second portion of the workpiece;
    removing the patterned second portion of the workpiece;
    patterning the hard mask of the workpiece using the second spacers as an etch mask; and
    patterning the first portion of the workpiece using the hard mask as an etch mask, wherein the forming the first spacers, the patterning the second portion of the workpiece using the first spacers as an etch mask, the forming the second spacers, and the patterning the hard mask of the workpiece using the second spacers as an etch mask are performed in-situ in an etching chamber.

2. The method according to claim 1, wherein forming the material layer comprises forming a layer of photoresist.

3. The method according to claim 1, wherein forming the second spacers comprises forming the second spacers using $[C_{(n)}H_{(2n+2)}+N_2]$ plasma or $C_{(n)}H_{(2n+2)}$ plasma.

4. The method according to claim 1, wherein patterning the first portion of the workpiece comprises patterning an insulating material layer.

5. The method according to claim 4, further comprising forming a conductive material over the insulating material layer.

6. The method according to claim 5, wherein forming the conductive material comprises forming a plurality of conductive lines in the insulating material layer.

7. A method of manufacturing a semiconductor device, the method comprising:
    forming a first material layer over a substrate;
    forming a hard mask over the first material layer;
    forming a second material layer over the hard mask;
    forming a layer of photoresist over the second material layer;
    patterning the layer of photoresist;
    forming first spacers on sidewalls of the patterned layer of photoresist, the forming the first spacers comprises forming a nitrogen-containing hydrogenated amorphous carbon (a-C:H:N) film;
    removing the patterned layer of photoresist;
    patterning the second material layer using the first spacers as an etch mask;
    removing the first spacers;
    forming second spacers on sidewalls of the patterned second material layer, the forming the second spacers comprises forming a nitrogen-containing hydrogenated amorphous carbon (a-C:H:N) film;
    removing the patterned second material layer;
    patterning the hard mask using the second spacers as an etch mask;
    removing the second spacers;
    after removing the second spacers, patterning the first material layer to form first trenches using the hard mask as an etch mask, wherein the forming the first spacers, the patterning the second material layer using the first spacers as an etch mask, the removing the first spacers, the forming the second spacers, the patterning the hard mask using the second spacers as an etch mask, and the removing the second spacers are performed in-situ in a single processing chamber; and
    forming a conductive material in the first trenches and over the patterned hard mask.

8. The method according to claim 7, wherein forming the first material layer comprises forming a low-k dielectric material having a dielectric constant less than a dielectric constant of silicon dioxide.

9. The method according to claim 7, wherein forming the hard mask comprises forming an oxide material or a metal.

10. The method according to claim 7, wherein patterning the layer of photoresist comprises patterning a minimum feature size of the semiconductor device.

11. The method according to claim 10, wherein forming the first spacers comprises forming first spacers comprising a width of about ½ the minimum feature size of the semiconductor device.

12. The method according to claim 11, wherein forming the second spacers comprises forming second spacers comprising a width of about ¼ the minimum feature size of the semiconductor device.

13. A method of manufacturing a semiconductor device, the method comprising:
    forming a first material layer over a substrate;
    forming a hard mask over the first material layer;
    forming a second material layer over the hard mask;

forming a layer of photoresist over the second material layer;

patterning the layer of photoresist;

forming a first spacer material over the patterned layer of photoresist;

etching the first spacer material to remove the first spacer material from a top surface of the layer of photoresist and a top surface of the second material layer, leaving first spacers on sidewalls of the patterned layer of photoresist;

removing the patterned layer of photoresist;

patterning the second material layer using the first spacers as an etch mask;

removing the first spacers;

forming a second spacer material over the patterned second material layer using a $[C_{(n)}H_{(2n+2)}+N_2]$ plasma;

etching the second spacer material to remove the second spacer material from a top surface of the second material layer and a top surface of the hard mask, leaving second spacers on sidewalls of the patterned second material layer;

removing the patterned second material layer;

patterning the hard mask using the second spacers as an etch mask;

removing the second spacers; and after removing the second spacers, patterning the first material layer using the hard mask as an etch mask, wherein forming the first spacer material, etching the first spacer material, removing the patterned layer of photoresist, patterning the second material layer, removing the first spacers, forming the second spacer material, etching the second spacer material, removing the patterned second material layer, patterning the hard mask, removing the second spacers, and patterning the first material layer are performed in-situ in an etching chamber, without removing the semiconductor device from the etching chamber.

14. The method according to claim 13, wherein etching the first spacer material or etching the second spacer material comprises an anisotropic etch process.

15. The method according to claim 13, wherein forming the first material layer comprises forming an etch stop layer and forming an insulating material over the etch stop layer, and wherein patterning the first material layer comprises removing a portion of the insulating material, but not removing a substantial portion of the etch stop layer.

16. The method according to claim 13, wherein forming the second material layer comprises forming a bottom layer and forming a middle layer over the bottom layer.

17. The method according to claim 16, wherein forming the bottom layer comprises forming a carbon organic material or wherein forming the middle layer comprises forming a silicon-containing carbon film.

18. The method of claim 13, wherein the forming the first spacer material comprises forming the first spacer material using a $[C_{(n)}H_{(2n+2)}+N_2]$ plasma.

19. The method of claim 13, wherein the forming a hard mask comprising forming a metal-containing layer.

20. The method of claim 7 wherein the forming the first spacers comprises forming the first spacers using a $[C_{(n)}H_{(2n+2)}+N_2]$ plasma, and wherein the forming the second spacers comprises forming the second spacers using a $[C_{(n)}H_{(2n+2)}+N_2]$ plasma.

* * * * *